(12) United States Patent
Kim et al.

(10) Patent No.: US 10,403,441 B2
(45) Date of Patent: Sep. 3, 2019

(54) COMPOSITE ELECTRONIC COMPONENT

(71) Applicant: SAMSUNG ELECTRO-MECHANICS CO., LTD., Suwon-si, Gyeonggi-do (KR)

(72) Inventors: Ho Yoon Kim, Suwon-si (KR); Kyung Hwa Yu, Suwon-si (KR); Man Su Byun, Suwon-si (KR); Dae Heon Jeong, Suwon-si (KR); Min Kyoung Cheon, Suwon-si (KR); Soo Hwan Son, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/974,285

(22) Filed: May 8, 2018

(65) Prior Publication Data

US 2019/0180945 A1    Jun. 13, 2019

(30) Foreign Application Priority Data

Dec. 8, 2017    (KR) .................. 10-2017-0168112

(51) Int. Cl.
*H01G 4/012* (2006.01)
*H01G 4/40* (2006.01)
(Continued)

(52) U.S. Cl.
CPC .............. *H01G 4/40* (2013.01); *H01G 4/224* (2013.01); *H01G 4/232* (2013.01); *H01G 4/248* (2013.01);
(Continued)

(58) Field of Classification Search
CPC ........ H01G 4/005; H01G 4/006; H01G 4/012; H01G 4/12; H01G 4/30; H01G 4/38; H01G 4/232; H01G 4/328
See application file for complete search history.

(56) References Cited

U.S. PATENT DOCUMENTS

2014/0131082 A1* 5/2014 Ahn ..................... H05K 3/3442
                                                     174/260
2014/0232485 A1* 8/2014 Bultitude ................. H01G 4/30
                                                     333/175

(Continued)

FOREIGN PATENT DOCUMENTS

JP      2000-114005 A    4/2000
KR    10-2016-0055424 A   5/2016

*Primary Examiner* — Nguyen T Ha
(74) *Attorney, Agent, or Firm* — Morgan, Lewis & Bockius LLP (57) ABSTRACT

A composite electronic component includes a multilayer capacitor including a capacitor body, which includes first and second internal electrodes facing each other and a plurality of dielectric layers each interposed therebetween and first and second external electrodes disposed on opposing ends of the capacitor body, a high-rigidity chip including a substrate disposed on a lower side of the multilayer capacitor and first and second discharge electrodes disposed on the substrate and spaced apart from each other, the first and second discharge electrodes being connected to the first and second external electrodes, respectively, and extending to an upper or lower surface of the substrate, and an sealing part covering the first and second discharge electrodes and including a space portion, which is provided between the first and second discharge portions.

11 Claims, 12 Drawing Sheets

(51) Int. Cl.
    *H01G 4/30*     (2006.01)
    *H01G 4/232*     (2006.01)
    *H01G 4/248*     (2006.01)
    *H01G 4/224*     (2006.01)
    *H02H 9/02*     (2006.01)
    *H05K 1/18*     (2006.01)
    *H01G 4/12*     (2006.01)

(52) U.S. Cl.
    CPC ............... H01G 4/30 (2013.01); H02H 9/02 (2013.01); *H01G 4/012* (2013.01); *H01G 4/1227* (2013.01); *H05K 1/181* (2013.01); *H05K 2201/10015* (2013.01); *H05K 2201/2045* (2013.01)

(56) References Cited

U.S. PATENT DOCUMENTS

| | | | | |
|---|---|---|---|---|
| 2015/0036248 | A1* | 2/2015 | Umeda | H02H 9/044 |
| | | | | 361/56 |
| 2015/0221440 | A1* | 8/2015 | Chung | H01G 4/30 |
| | | | | 29/25.41 |
| 2015/0340154 | A1* | 11/2015 | Kim | H01G 2/14 |
| | | | | 174/260 |
| 2016/0133386 | A1 | 5/2016 | Park et al. | |
| 2016/0205769 | A1* | 7/2016 | Park | H01G 4/224 |
| | | | | 174/260 |
| 2016/0344181 | A1* | 11/2016 | Matsunaga | H01G 4/005 |
| 2017/0236640 | A1* | 8/2017 | Kim | H01G 2/14 |
| | | | | 361/220 |

* cited by examiner

PRIOR ART

FIG. 9

PRIOR ART

COMPOSITE ELECTRONIC COMPONENT

CROSS-REFERENCE TO RELATED APPLICATION

This application is based on and claims the benefit of priority to Korean Patent Application No. 10-2017-0168112 filed on Dec. 8, 2017 in the Korean Intellectual Property Office, the entire disclosure of which is incorporated herein by reference.

TECHNICAL FIELD

The present disclosure relates to a composite electronic component.

BACKGROUND

Recently, as electric vehicles have become prevalent, demand for resistance to electrostatic discharge (ESD) of electronic components and reliability in terms of resistance to an overcurrent due to a short-circuit in case of failure has increased.

In order to improve resistance to ESD, it is necessary to prevent interlayer breakdown of internal electrodes when ESD is applied, for which an interlayer spacing of the internal electrodes of a multilayer capacitor may be adjusted to be increased.

Also, in order to address short-circuit defect, it is possible to increase a long-directional margin of external electrode part where cracks frequently occur due to external force so that a short-circuit between internal cracks may not occur even in the case that cracks occur.

However, if the interlayer spacing between the internal electrodes is increased or the margin between the internal electrode and an external surface is increased, capacitance, major characteristics of the multilayer capacitor, may be reduced.

In addition, when the multilayer capacitor is mounted on a board, a bending crack may occur in the multilayer capacitor due to bending of the board.

Meanwhile, when the multilayer capacitor is mounted on a board, acoustic noise may be generated due to vibrations based on a piezoelectric phenomenon in terms of the characteristics of a dielectric.

SUMMARY

An aspect of the present disclosure may provide a composite electronic component capable of enhancing ESD durability, preventing an overcurrent problem and a bending crack due to a short-circuit in case of failure, and reducing acoustic noise, while reducing a reduction in capacitance.

According to an aspect of the present disclosure, a composite electronic component may include: a multilayer capacitor including a capacitor body, which includes and first and second internal electrodes facing each other and a plurality of dielectric layers each interposed therebetween, and first and second external electrodes disposed on opposing ends of the capacitor body; a high-rigidity chip including a substrate disposed on a lower side of the multilayer capacitor and first and second discharge electrodes disposed on the substrate and spaced apart from each other, the first and second discharge electrodes being connected to the first and second external electrodes, respectively, and extending to an upper or lower surface of the substrate; and an sealing part covering the first and second discharge electrodes and including a space portion, which is provided between the first and second discharge portions.

The capacitor body may include first and second surfaces opposing each other, third and fourth surfaces connected to the first and second surfaces and opposing each other, and fifth and sixth surfaces connected to the first to fourth surfaces and opposing each other, each of the first and second internal electrodes may have one end exposed to the third and fourth surfaces, and the first and second external electrodes may include a first connection portion and a second connection portion disposed on the third and fourth surfaces of the capacitor body, respectively, and a first band portion and a second band portion extending from the first and second connection portions, respectively, to portions of the first and second surfaces and portions of the fifth and sixth surfaces of the capacitor body, the first and second connection portions being connected to the first and second discharge electrodes, respectively.

The composite electronic component may further include: a first terminal electrode covering portions of the first connection portion, the first band portion disposed on the first surface of the capacitor body, one end surface of the sealing part, and a portion of a lower surface of the sealing part; and a second terminal electrode covering portions of the second connection portion, the second band portion disposed on the first surface of the capacitor body, another end surface of the sealing part, and a portion of the lower surface of the sealing part.

The high-rigidity chip may be formed of alumina.

Portions of the first and second discharge portions may be disposed on a lower surface of the substrate.

Portions of the first and second discharge portions may be disposed on an upper surface of the substrate.

The composite electronic component may further include an electrostatic discharge (ESD) functional member disposed in the space portion and connecting the first and second discharge portions.

Portions of the first and second discharge portions and the ESD functional member may be disposed on a lower surface of the substrate.

Portions of the first and second discharge portions and the ESD functional member may be disposed on an upper surface of the substrate.

A gap between the first and second discharge portions in the space portion may be 1 to 20 μm.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Figure 1:
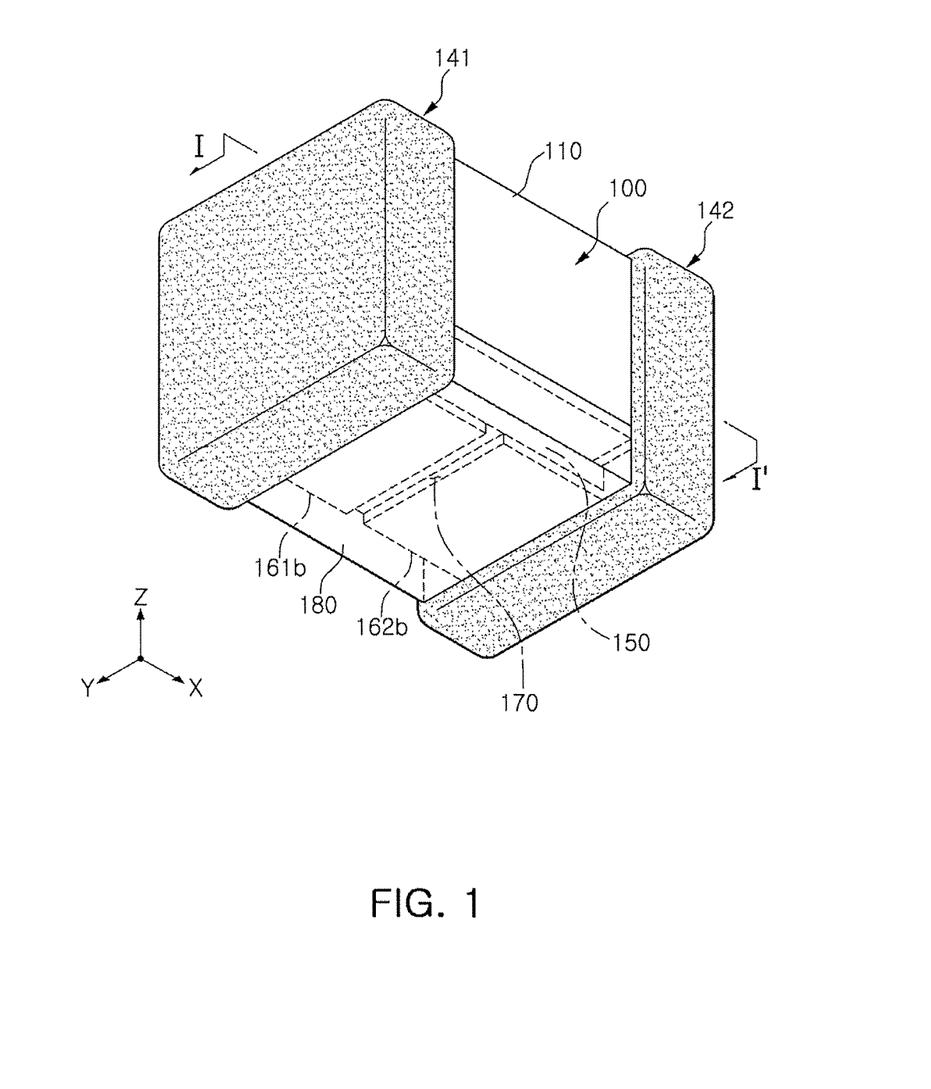
FIG. 1 is a transparent perspective view schematically illustrating a composite electronic component according to a first exemplary embodiment in the present disclosure.
Figure 2:
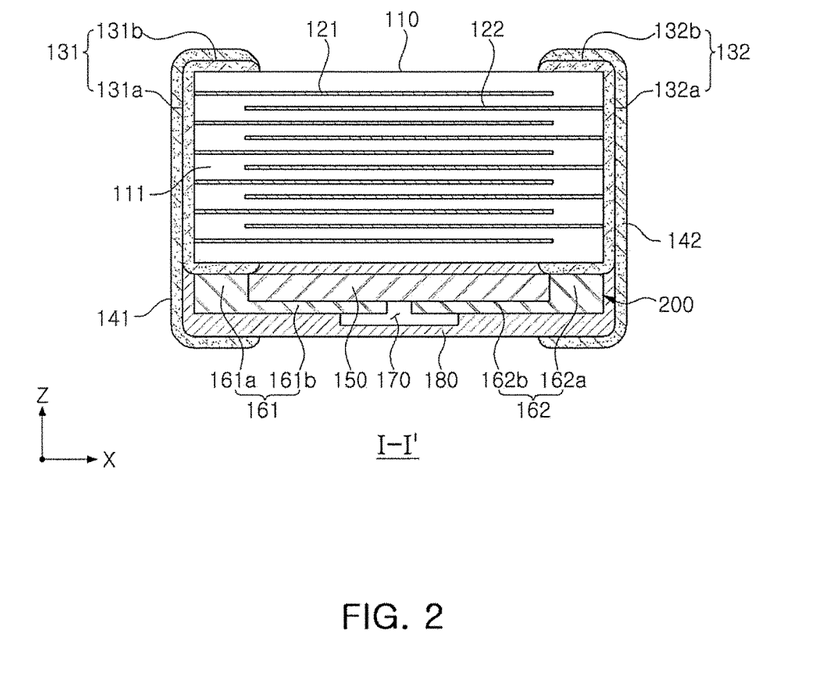
FIG. 2 is a cross-sectional view, taken along line 1-1' of FIG. 1.
Figure 3A:
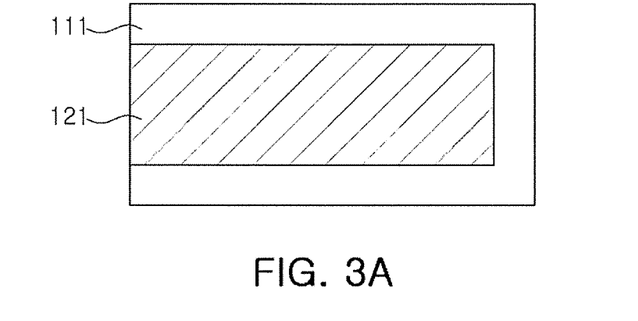
FIGS. 3A and 3B are plan views illustrating first and second internal electrodes of FIG. 1, respectively.
Figure 3B:
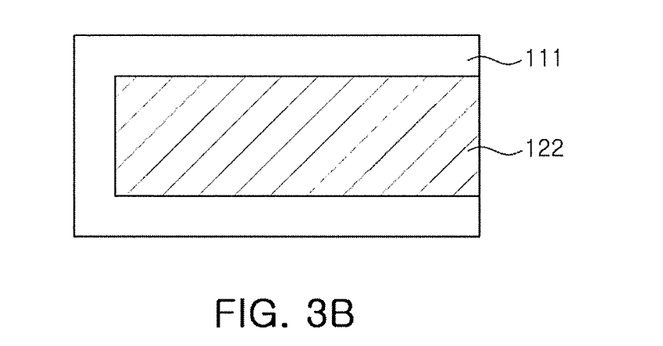

FIG. 1 is a transparent perspective view schematically illustrating a composite electronic component according to a first exemplary embodiment in the present disclosure, FIG. 2 is a cross-sectional view, taken along line 1-1' of FIG. 1, and FIGS. 3A and 3B are plan views illustrating first and second internal electrodes of FIG. 1, respectively.

Hereinafter, preferred exemplary embodiments in the present disclosure will be described with reference to the accompanying drawings.

Here, X, Y, and Z in the drawings are defined as a length direction, a width direction, and a thickness direction of a capacitor body, respectively. Further, the thickness direction may be used as having the same concept as a stacking direction of dielectric layers.

Referring to FIGS. 1 through 3, a composite electronic component according to a first exemplary embodiment in the present disclosure includes a multilayer capacitor 100, a high-rigidity chip 200, and an encapsulating part 180.

The multilayer capacitor 100 includes a capacitor body 110 and first and second external electrodes 131 and 132.

The capacitor body 110 includes a plurality of dielectric layers 111 and first and second internal electrodes 121 and 122 stacked to face each other with the dielectric layer 111 interposed therebetween.

In one exemplary embodiment in the present disclosure, a shape of the capacitor body 110 is not limited but may be a hexahedral shape as illustrated.

The capacitor body 110 includes first and second surfaces opposing each other in the Z direction, third and fourth surfaces connected to the first and second surfaces and opposing each other in the X direction, and fifth and sixth surfaces connected to first and second surfaces, connected to the third and fourth surfaces, and opposing each other in the Y direction. Here, the first surface, a lower surface of the capacitor body 110, may be a surface facing a mounting direction.

The plurality of dielectric layers 111 constituting the capacitor body 110 are in a sintered state and adjacent dielectric layers 111 may be integrated such that boundaries therebetween may not be readily apparent.

The dielectric layer 111 may be formed by sintering a ceramic green sheet including ceramic powder, an organic solvent, and an organic binder.

The ceramic powder, a material having a high dielectric constant, may be formed of a barium titanate ($BaTiO_3$)-based material, a strontium titanate ($SrTiO_3$)-based material, and the like, but is not limited thereto.

One ends of the first and second internal electrodes 121 and 122 may be exposed to the third and fourth surfaces of the capacitor body 110, respectively.

The first and second internal electrodes 121 and 122 may be formed of a conductive paste containing a conductive metal.

The conductive metal may be, but is not limited to, nickel (Ni), copper (Cu), palladium (Pd), or an alloy thereof.

The first and second internal electrodes 121 and 122 may be formed by printing conductive paste on the ceramic green sheet forming the dielectric layer 111 through a printing method such as a screen printing method or a gravure printing method. The capacitor body 110 may be formed by alternately laminating the ceramic green sheets with the internal electrodes printed thereon and sintering the same.

The first and second external electrodes 131 and 132 are disposed at opposing ends of the capacitor body 110 in the X direction.

The first and second external electrodes 131 and 132 include first and second connection portions 131a and 132a disposed on the third and fourth surfaces of the capacitor body 110 and first and second band portions 131b and 132b extending from the first and second connection portions 131a and 132a to portions of the first and second surfaces of the capacitor body 110, respectively.

The first and second band portions 131b and 132b may further extend to portions of the fifth and sixth surfaces of the capacitor body 110.

The high-rigidity chip 200 includes a substrate 150 and first and second discharge electrodes 161 and 162 disposed on a lower side of the multilayer capacitor 100.

Hereinafter, for the purposes of description, in the following descriptions of the exemplary embodiment in the present disclosure, surfaces of the high-rigidity chip 200 and an sealing part facing in the same directions as those of the six surfaces of the capacitor body 110, respectively, are defined as the same surfaces.

The substrate 150 may be formed of a highly rigid material, for example, alumina ($Al_2O_3$).

Here, a length and width of the substrate 150 may be smaller than a length and width of the multilayer capacitor 100 by 0.1 to 0.3 mm, and a thickness of the substrate 150 may be 0.05 to 0.15 mm.

The first and second discharge electrodes 161 and 162 include first and second connection portions 161a and 162a and first and second discharge portions 161b and 162b, respectively.

The first and second connection portions 161a and 162a may cover opposing ends of the substrate 150 in the X direction and may be electrically connected to the first and second band portions 131b and 132b on a lower side of the first and second external electrodes 131 and 132, respectively.

Here, the first and second connection portions 161a and 162a and the first and second band portions 131b and 132b may be adhered using a conductive adhesive, a conductive resin, or the like.

The first and second discharge portions 161b and 162b are portions extending from the first and second connection portions 161a and 162a to an upper surface or a lower surface of the substrate 150, respectively, and are formed to be spaced apart from each other in the X direction.

The first and second discharge portions 161b and 162b may be arranged to face each other in the X direction on the same plane. In this exemplary embodiment, it is illustrated that the first and second discharge portions 161b and 162b are disposed on the lower surface of the substrate 150.

Here, a space portion 170 provided between the first and second discharge portions 161b and 162b (to be described later) serves to bypass ESD.

A gap between the first and second discharge portions 161b and 162b in the space portion 170 serves to determine an ESD turn-on voltage and may be 1 to 20 μm. Here, the turn-on voltage refers to a voltage by which high-voltage static electricity flows to a lead electrode due to ESD.

In case where a current having a high voltage flows in an electronic component (i.e., capacitor) but it does not flow to a lead electrode, a degree to which the capacitor withstands ESD applied thereto is related to a distance between internal electrodes of the capacitor. Here, if the ESD voltage that the capacitor withstands is lower than a turn-on voltage of the first and second discharge portions 161b and 162b, damages such as cracks may occur in the capacitor.

The first and second discharge electrodes 161 and 162 may be formed of a conductive paste containing a conductive metal.

The conductive metal may include at least one of copper (Cu), silver (Ag), palladium (Pd), tin (Sn), nickel (Ni), and gold (Au), or a compound thereof but is not limited thereto.

The first and second discharge electrodes 161 and 162 may be formed on the substrate 150 using a laser scribing apparatus.

Meanwhile, although not shown, a nickel/tin (Ni/Sn) plating layer may be further formed on the outside of the first and second discharge electrodes 161 and 162 through plating.

The sealing part 180 covers the first and second discharge electrodes 161 and 162 and the space portion 170 separating the first and second discharge portions 161b and 162b from each other is positioned therein.

The sealing part 180 serves to protect the high-rigidity chip 200 including the substrate 150 and the first and second discharge electrodes 161 and 162 from an external environment.

The sealing part 180 may include, for example, an epoxy resin as an insulating material, and the material thereof is not limited.

The composite electronic component of the present exemplary embodiment may further include first and second terminal electrodes 141 and 142.

The first terminal electrode 141 may cover portions of the first connection portion 131a and the first band portion 131b of the first external electrode 131 disposed on the second surface of the capacitor body 110 and one end surface and a portion of a lower surface of the sealing part 180. That is, the first terminal electrode 141 may cover one lower corner of the sealing part 180.

The second terminal electrode 142 may cover portions of the second connection portion 132a and the second band portion 132b of the second external electrode 132 disposed on the second surface of the capacitor body 110 and the other end surface and a portion of the lower surface of the sealing part 180. That is, the second terminal electrode 142 may cover the other lower corner of the sealing part 180.

The first and second terminal electrodes 141 and 142 may be formed of a conductive paste containing a conductive metal.

The conductive metal may be, but is not limited to, nickel (Ni), copper (Cu), tin (Sn), or an alloy thereof.

The first and second terminal electrodes 141 and 142 may be formed by dipping, but any other method such as plating may also be used.

Also, although not shown, a nickel/tin (Ni/Sn) plating layer based on plating may further be disposed on the outside of the first and second terminal electrodes 141 and 142.

Figure 4:
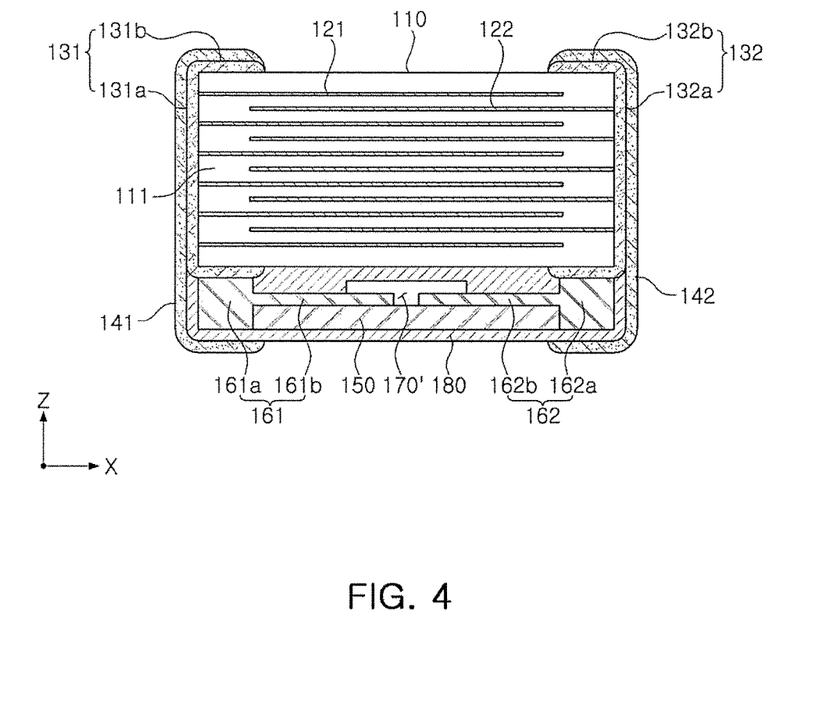
FIG. 4 is a cross-sectional view schematically illustrating a composite electronic component according to a second exemplary embodiment in the present disclosure.

Referring to FIG. 4, the first and second discharge portions 161b and 162b of the first and second discharge electrodes 161 and 162 extend from the first and second connection portions 161a and 162a to an upper surface of the substrate 150, and a space portion 170' is connected to the first and second discharge portions 161b and 162b on the upper surface of the substrate 150.

Meanwhile, according to another exemplary embodiment in the present disclosure, ESD functional member 190 may be disposed in the space portion to connect the first and second discharge portions 161b and 162b.

The ESD functional member 190 may serve to enhance ESD durability and adjust an ESD turn-on voltage. The ESD functional member may be an ESD suppressor but is not limited thereto.

The ESD functional member 190 may include, but is not limited to, a conductive polymer. When a signal voltage input from a signal interface through which a signal is transmitted to a system or an IC from a connector, an IC block of a power supply terminal, or a communication line is at a rated voltage (circuit voltage) level, the conductive polymer has properties of a non-conductor, but when an overvoltage such ESD occurs instantaneously, the conductive polymer has properties of a conductor.

Figure 5:
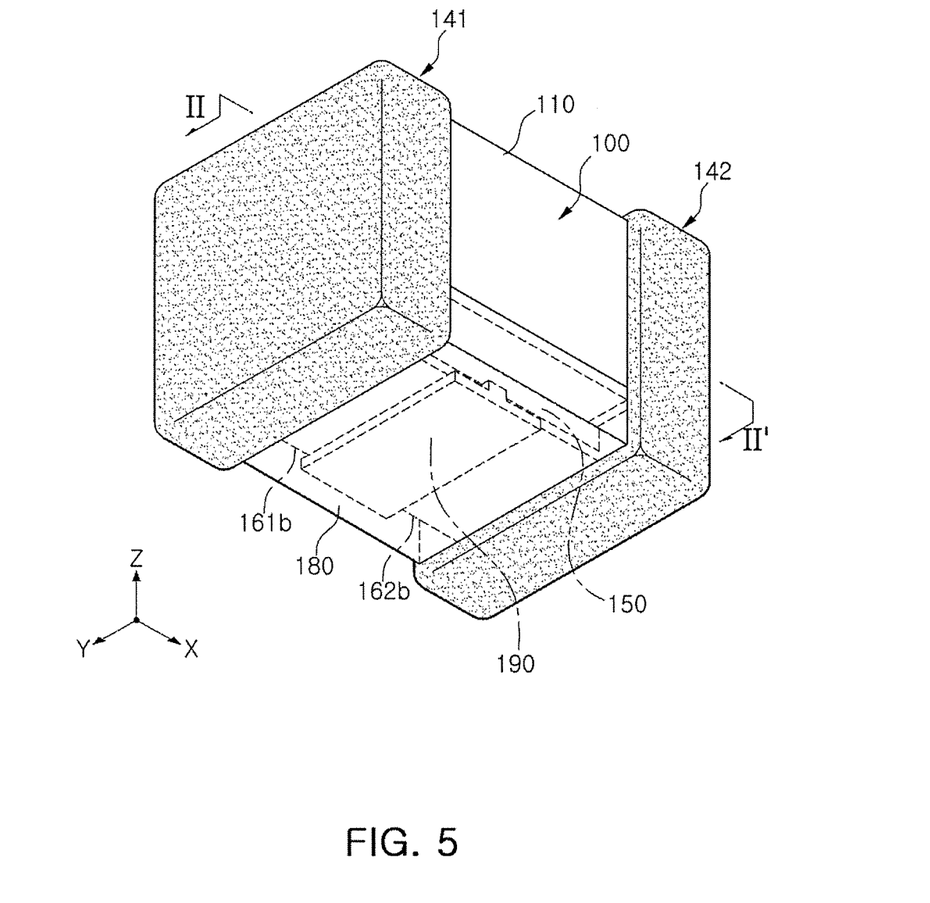
FIG. 5 is a transparent perspective view schematically illustrating a composite electronic component according to a third exemplary embodiment in the present disclosure.
Figure 6:
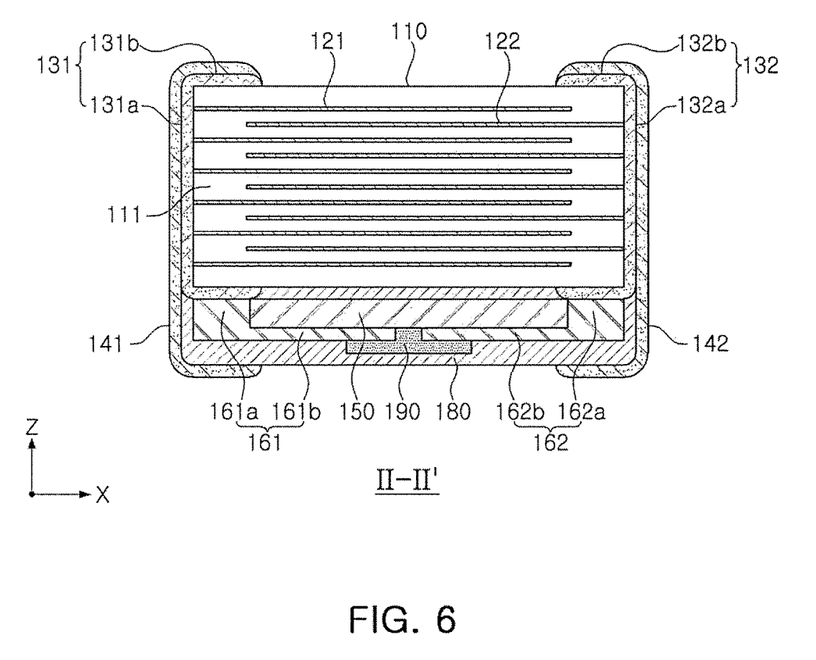
FIG. 6 is a cross-sectional view, taken along line II-II' of FIG. 5.

When an overvoltage such as ESD occurs, the first and second discharge portions 161b and 162b may be short-circuited to each other due to the ESD functional member 190 having the properties of a conductor. Referring to FIGS. 5 and 6, the first and second discharge portions 161b and 162b may be arranged on the lower surface of the substrate 150 and the ESD functional member 190 may be connected to the first and second discharge portions 161b and 162b on the lower surface of the substrate 150.

Figure 7:
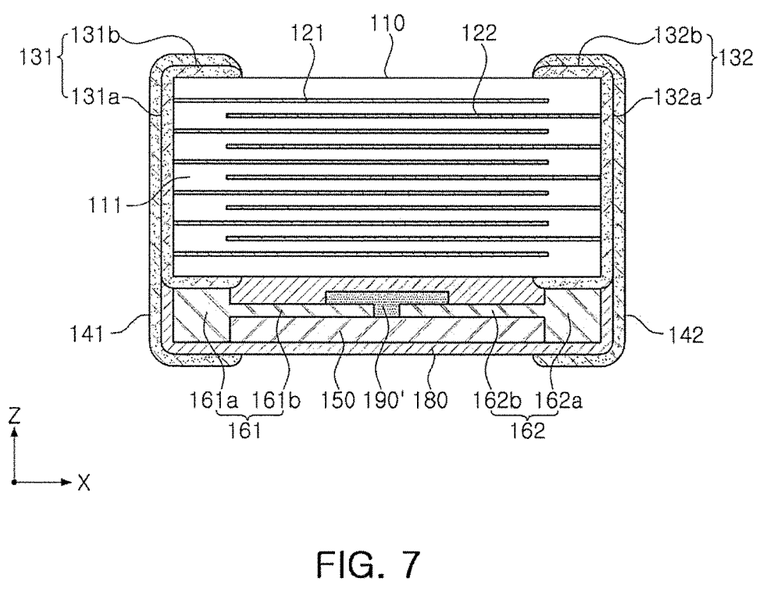
FIG. 7 is a cross-sectional view schematically illustrating a composite electronic component according to a fourth exemplary embodiment in the present disclosure.

Referring to FIG. 7, the first and second discharge portions 161b and 162b may be formed on an upper surface of the substrate 150 and the ESD functional member 190' may be arranged to be connected to the first and second discharge portions 161b and 162b on the upper surface of the substrate 150.

The multilayer capacitor is an open circuit in direct current (DC) power supply. However, when a crack occurs in the capacitor body due to an external environment, the internal electrodes may overlap each other or a current path may occur to cause failure due to a short-circuit.

Failure due to a short-circuit causes an overcurrent to flow to an undesired line to negatively affect other components. In the related art, it is designed such that a margin of the external electrode, which are liable to be cracked by an external force, is increased so that a short-circuit may not occur between both electrodes of the internal electrodes although a crack occurs. In this case, however, the increase in the margin relatively reduces an area of the internal electrodes realizing capacitance. According to the present disclosure, the high-rigidity chip having the discharge electrodes is attached to the lower surface of the multilayer capacitor to provide an ESD suppressor serving to bypass ESD, whereby an ESD protection function may be realized without changing the design of the internal electrodes of the multilayer capacitor.

Table 1 shows the results of testing, at 25 kV, ESD durability of 10 samples having the conventional MLCC structure without a high-rigidity chip according to a comparative example. Table 2 shows the results of testing, at 25 kV, ESD durability of 10 composite electronic components of the present disclosure according to an inventive example. Here, all the MLCCs having a length and a width of 16*8 mm were used. Here, #1 to #10 ("comparative example 1") and #21 to #30 ("inventive example 1") are 1 nF products and #11 to #20 ("comparative example 2") and #31 to #40 ("inventive example 2") are 10 nF products.

TABLE 1

| # | Before test IR (Ω) | After test IR (Ω) |
| --- | --- | --- |
| 1 | 4.14E*10 | Short occurs |
| 2 | 6.53E*10 | 9.15E*10 |
| 3 | 8.59E*10 | 3.47E*10 |
| 4 | 3.43E*10 | Short occurs |
| 5 | 3.28E*10 | 3.16E*10 |
| 6 | 6.05E*10 | Short occurs |
| 7 | 5.37E*10 | 2.72E*10 |
| 8 | 3.09E*10 | Short occurs |
| 9 | 3.52E*10 | 5.41E*10 |
| 10 | 3.11E*10 | Short occurs |
| 11 | 1.32E*10 | Short occurs |
| 12 | 2.07E*10 | Short occurs |
| 13 | 1.63E*10 | Short occurs |
| 14 | 6.17E*10 | Short occurs |
| 15 | 1.58E*10 | Short occurs |
| 16 | 1.95E*10 | Short occurs |
| 17 | 1.35E*10 | Short occurs |
| 18 | 1.22E*10 | Short occurs |
| 19 | 8.48E*10 | Short occurs |
| 20 | 1.34E*10 | Short occurs |

TABLE 2

| # | Before test IR (Ω) | After test IR (Ω) |
| --- | --- | --- |
| 21 | 3.95E*10 | 1.16E*10 |
| 22 | 4.14E*10 | 7.15E*10 |
| 23 | 5.13E*10 | 9.53E*10 |
| 24 | 5.43E*10 | 1.73E*10 |
| 25 | 2.95E*10 | 7.59E*10 |
| 26 | 2.97E*10 | 7.67E*10 |
| 27 | 2.63E*10 | 1.05E*10 |
| 28 | 2.80E*10 | 1.09E*10 |
| 29 | 2.97E*10 | 1.39E*10 |
| 30 | 2.49E*10 | 1.29E*10 |
| 31 | 6.41E*10 | 1.76E*10 |
| 32 | 2.08E*10 | 1.69E*10 |
| 33 | 6.47E*10 | 1.40E*10 |
| 34 | 2.24E*10 | 1.44E*10 |
| 35 | 2.08E*10 | 1.45E*10 |
| 36 | 3.51E*10 | 1.74E*10 |
| 37 | 8.71E*10 | 1.67E*10 |
| 38 | 2.24E*10 | 1.58E*10 |
| 39 | 2.40E*10 | 1.69E*10 |
| 40 | 6.19E*10 | 1.88E*10 |

Referring to Table 1 and Table 2, in the case of the comparative example, IR was decreased after the test and short-circuit occurred in many cases. In the case of the inventive example, IR before and after the test was good in all the samples. That is, according to the present exemplary embodiment, the effect of improving ESD durability and preventing the short-circuit may be expected.

In a state in which the composite electronic component is mounted on a board, when voltages having the opposite polarities are applied to terminals formed on opposing sides of the composite electronic component in the length direction, the capacitor body expands and contracts in the thickness direction Z due to an inverse piezoelectric effect of the dielectric layer and opposing side portions of the terminals contract and expand, opposite to expansion and contraction of the capacity body in the thickness direction, due to a Poisson effect.

Here, since the composite electronic component according to an exemplary embodiment in the present disclosure includes the high-rigidity chip disposed on the lower surface of the capacitor body, the high-rigidity chip reduces stress transmitted from the multilayer capacitor to the board, reducing transmission of vibrations to the board due to inverse piezoelectric properties of the capacitor body when the composite electronic component is mounted on the board, resulting in a reduction in acoustic noise.

Figure 8:
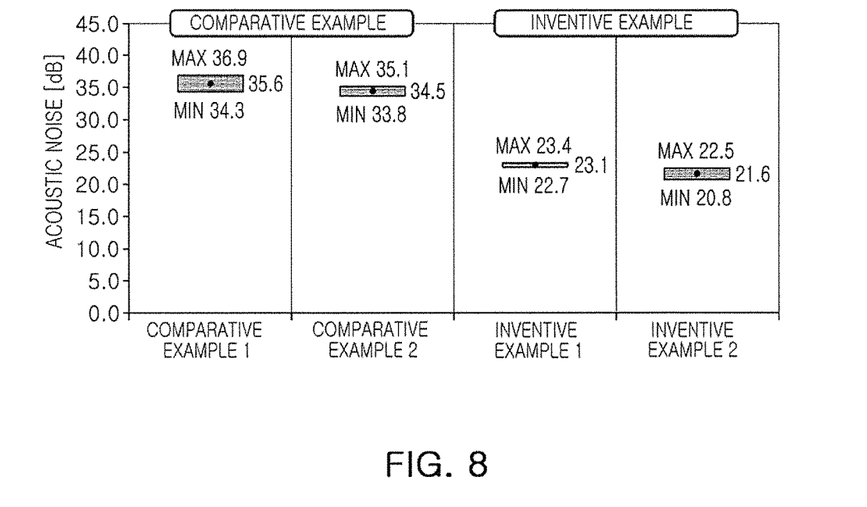
FIG. 8 is a graph illustrating comparison between acoustic noise of the related art composite electronic component and a composite electronic component of the present exemplary embodiment.

Referring to FIG. 8, it can be seen that the composite electronic component of the present exemplary embodiment has an acoustic noise reduction effect of 12 to 13 dB, compared to the electronic component of the comparative example which does not include a high-rigidity chip. Comparative example 1 and inventive example 1 represent a 1 nF model, and comparative example 2 and inventive example 2 represent a 10 nF model.

Also, according to the present disclosure, since the high-rigidity chip disposed on the lower surface of the multilayer capacitor prevents occurrence of a bending crack of the multilayer capacitor due to bending of the board when the multilayer capacitor is mounted on the board, thus realizing an open failure mode.

Figure 9:
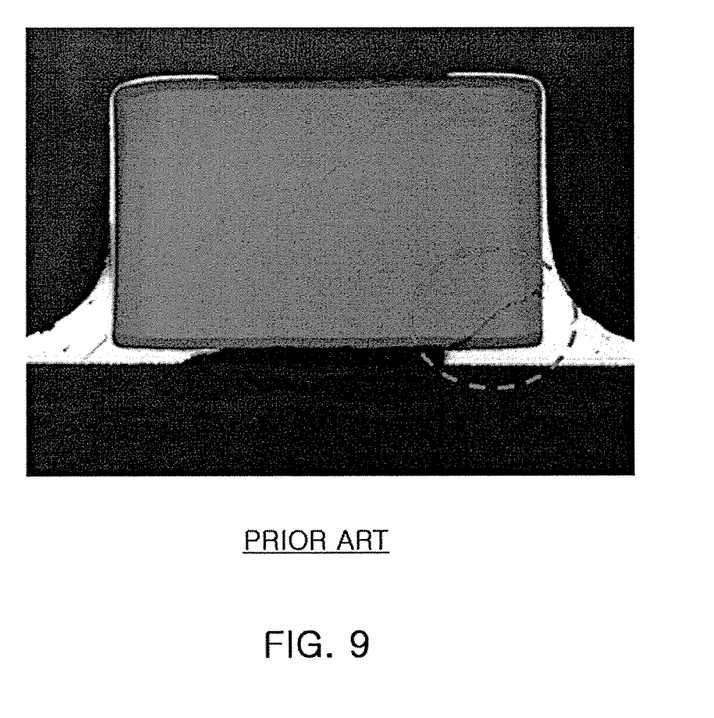
FIGS. 9 and 10 are photographs illustrating results of bending strength test of the related art composite electronic component.
Figure 10:
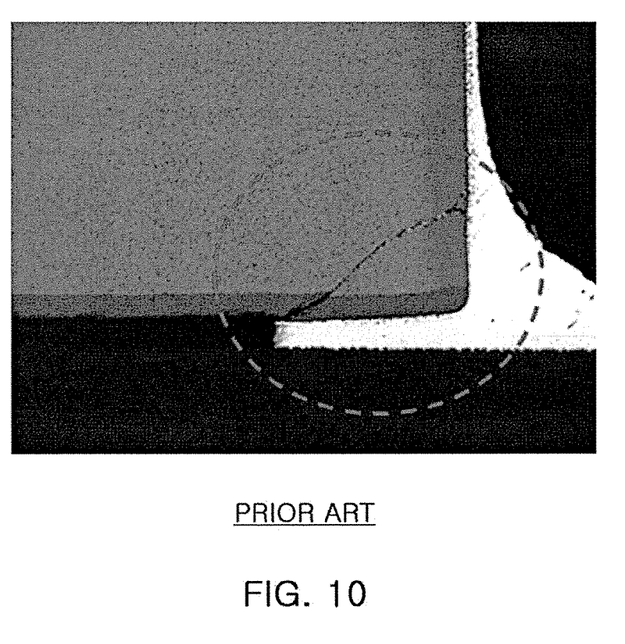
Figure 11:
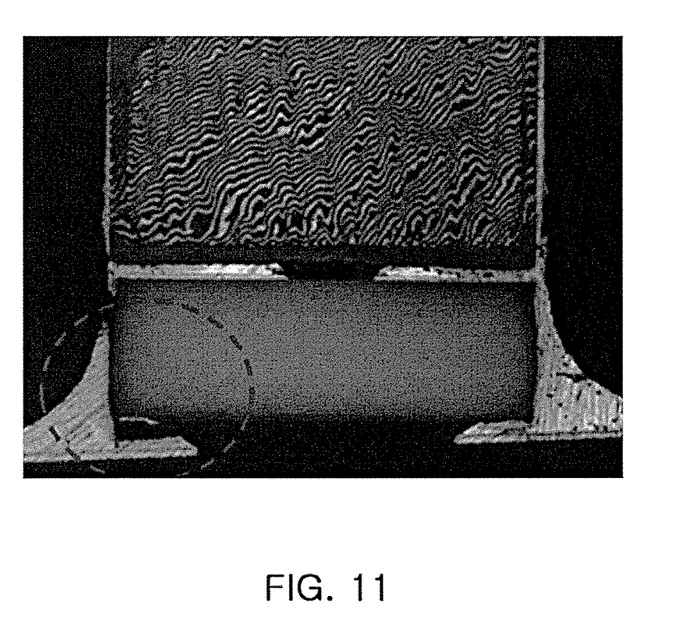
FIGS. 11 and 12 are photographs illustrating results of bending strength test of the composite electronic component of the present exemplary embodiment.
Figure 12:
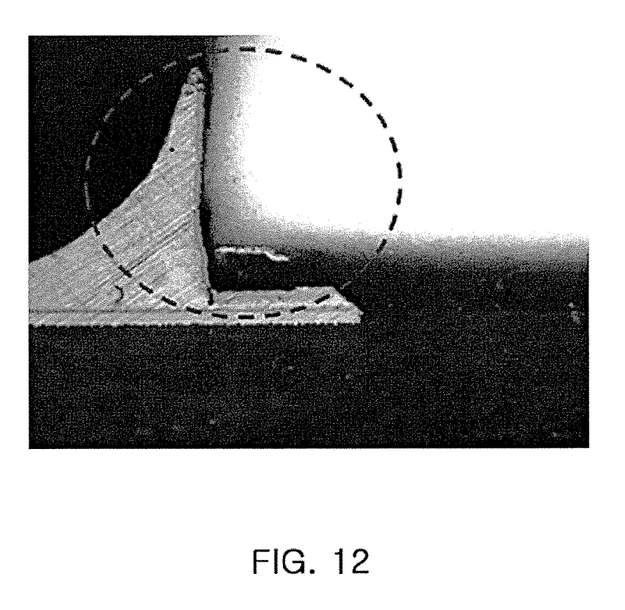

In this test, a bending strength test was carried out on each of the comparative example and the inventive example using 20 MLCCs of 1005 size under conditions of 15 mm and 10 sec, respectively. In the comparative example, cracks and short-circuits occurred in all the 20 samples as illustrated in FIGS. 9 and 10, and in the case of the inventive example, solder of an alumina chip portion fell out to cause an open defect only in 6 samples out of 20 samples as illustrated in FIGS. 11 and 12, while no cracks, short defects, and open defects occurred in the remaining 14 samples of the inventive example.

Meanwhile, if an interlayer thickness of the internal electrode is increased, a distance in the denominator of the dielectric constant formula increases to decrease capacitance, while if the margin in the X direction is increased, the area of the internal electrodes decreases to reduce an area of the numerator of the dielectric constant formula to decrease capacitance.

In the case of the present exemplary embodiment, it is not necessary to increase the interlayer thickness of the internal electrode or to increase the margin of the external electrode portion in the X direction, and thus, the reduction of the capacitance of the electronic component may be minimized.

As set forth above, according to exemplary embodiments of the present disclosure, since the high-rigidity chip including the discharge electrodes serving to by bypass ESD is attached to the lower part of the multilayer capacitor, the interlayer thickness of the internal electrode is not required to be increased or the margin of the external electrode part in the longer direction is not required to be increased, and thus, ESD durability may be enhanced, while the reduction in the capacitance is minimized, and an overcurrent due to a short-circuit in the event of a defect and a bending crack may be prevented to ensure high reliability and reduce acoustic noise as well.

While exemplary embodiments have been illustrated and described above, it will be apparent to those skilled in the art that modifications and variations could be made without departing from the scope of the present disclosure as defined by the appended claims.

What is claimed is:

1. A composite electronic component comprising:
a multilayer capacitor including a capacitor body, which includes first and second internal electrodes facing each other and a plurality of dielectric layers each interposed therebetween, and first and second external electrodes disposed on opposing ends of the capacitor body;
a high-rigidity chip including a substrate disposed on a lower side of the multilayer capacitor and first and second discharge electrodes disposed on the substrate and spaced apart from each other, the first and second discharge electrodes being connected to the first and second external electrodes, respectively, and extending to both side and upper surfaces of the substrate or extending to both side and lower surfaces of the substrate;
a sealing part covering the first and second discharge electrodes and including a space portion, which is provided between the first and second discharge electrodes; and
first and second terminal electrodes disposed on an exterior side of the multilayer capacitor and the high-rigidity chip,
wherein the first and second discharge electrodes are spaced apart from the first and second terminal electrodes, respectively.

2. The composite electronic component of claim 1, wherein
the capacitor body includes first and second surfaces opposing each other, third and fourth surfaces connected to the first and second surfaces and opposing each other, and fifth and sixth surfaces connected to the first to fourth surfaces and opposing each other,
each of the first and second internal electrodes has one end exposed to the third and fourth surfaces, respectively, and
the first and second external electrodes include a first connection portion and a second connection portion disposed on the third and fourth surfaces of the capacitor body, respectively, and a first band portion and a second band portion extending from the first and second connection portions, respectively, to portions of the first and second surfaces and portions of the fifth and sixth surfaces of the capacitor body, the first and second connection portions being connected to the first and second discharge electrodes, respectively.

3. The composite electronic component of claim 2, wherein
the first terminal electrode covers portions of the first connection portion, the first band portion disposed on the first surface of the capacitor body, one end surface of the sealing part, and a portion of a lower surface of the sealing part; and
the second terminal electrode covers portions of the second connection portion, the second band portion disposed on the first surface of the capacitor body, another end surface of the sealing part, and a portion of the lower surface of the sealing part.

4. The composite electronic component of claim 1, wherein
the high-rigidity chip is formed of alumina.

5. The composite electronic component of claim 1, wherein
portions of the first and second discharge electrodes are disposed on a lower surface of the substrate.

6. The composite electronic component of claim 1, wherein
portions of the first and second discharge electrodes are disposed on an upper surface of the substrate.

7. The composite electronic component of claim 1, further comprising:
an electrostatic discharge (ESD) functional member disposed in the space portion and connecting the first and second discharge electrodes.

8. The composite electronic component of claim 7, wherein
portions of the first and second discharge electrodes and the ESD functional member are disposed on a lower surface of the substrate.

9. The composite electronic component of claim 7, wherein
portions of the first and second discharge electrodes and the ESD functional member are disposed on an upper surface of the substrate.

10. The composite electronic component of claim 1, wherein
a gap between the first and second discharge electrodes in the space portion is 1 to 20 μm.

11. The Composite electronic component of claim 1, wherein the sealing part is arranged between the first discharge electrode and the first terminal electrode, and between the second discharge electrode and the second terminal electrode.

* * * * *